(12) United States Patent  (10) Patent No.: US 9,036,740 B2
Khoury et al.  (45) Date of Patent: *May 19, 2015

(54) PERFORMING IMAGE REJECTION ON BANDPASS SIGNALS

(71) Applicant: Silicon Laboratories Inc., Austin, TX (US)

(72) Inventors: John Khoury, Austin, TX (US); Yan Zhou, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 9 days.

This patent is subject to a terminal disclaimer.

(21) Appl. No.: 13/921,375

(22) Filed: Jun. 19, 2013

(65) Prior Publication Data

US 2014/0376651 A1 Dec. 25, 2014

(51) Int. Cl.
*H04L 27/22* (2006.01)
*H03D 1/04* (2006.01)

(52) U.S. Cl.
CPC ...................... *H03D 1/04* (2013.01)

(58) Field of Classification Search
CPC ............... H04L 25/03057; H04L 2025/03681; H04B 3/23; H03D 1/04
USPC ................. 375/332, 316, 346, 350, 351, 371; 455/296, 278.1, 63.1
See application file for complete search history.

(56) References Cited

U.S. PATENT DOCUMENTS

| | | | |
|---|---|---|---|
| 4,345,241 A | 8/1982 | Takeuchi et al. | |
| 6,744,829 B1 | 6/2004 | Mohindra | |
| 6,959,016 B1 | 10/2005 | Keeth et al. | |
| 7,158,586 B2 | 1/2007 | Husted | |
| 8,265,584 B2 * | 9/2012 | Khoury et al. | 455/296 |
| 8,326,252 B2 * | 12/2012 | Li et al. | 455/302 |
| 2005/0135521 A1 | 6/2005 | Nemer et al. | |
| 2005/0243949 A1 | 11/2005 | Khoini-Poorfard | |
| 2007/0080835 A1 * | 4/2007 | Maeda et al. | 341/120 |
| 2008/0096513 A1 * | 4/2008 | Lim et al. | 455/302 |
| 2010/0159858 A1 * | 6/2010 | Dent et al. | 455/131 |
| 2010/0167680 A1 * | 7/2010 | Li et al. | 455/302 |
| 2010/0330947 A1 * | 12/2010 | Khoury et al. | 455/302 |
| 2011/0013724 A1 * | 1/2011 | Metreaud et al. | 375/296 |

(Continued)

OTHER PUBLICATIONS

Keng Leong Fong, et al., "High-Frequency Nonlinearity Analysis of Common-Emitter and Differential-Pair Transconductance Stages," IEEE Journal of Solid State Circuits, vol. 33, No. 4, pp. 548-555, Apr. 1998.

(Continued)

*Primary Examiner* — Kenneth Lam

(74) *Attorney, Agent, or Firm* — Trop, Pruner & Hu, P.C.

(57) ABSTRACT

An image rejection (IR) circuit is configured to receive a complex signal from a radio frequency (RF) mixer, where the complex signal includes an in-phase signal portion and a quadrature signal portion. This IR circuit may include: an in-phase path to remove first mismatch information from the in-phase signal portion and associated with at least one in-phase multi-tap filter; a quadrature path to remove second mismatch information from the quadrature signal portion and associated with at least one quadrature multi-tap filter; and a correlation unit to independently update each of the multiple taps of the in-phase multi-tap filter and the quadrature multi-tap filter according to a priority scheme.

22 Claims, 7 Drawing Sheets

(56) References Cited

U.S. PATENT DOCUMENTS

2011/0170643 A1* 7/2011 Nagano et al. ............... 375/350
2011/0189970 A1* 8/2011 Ohshiro ...................... 455/302

OTHER PUBLICATIONS

Keng Leong Fong, et al., "A Class AB Monolithic Mixer for 900 MHz Applications," IEEE Journal of Solid State Circuits, pp. 1166-1172, Aug. 1997.
Keng Leong Fong, et al., "2.4 Monolithic Mixer for Wireless LAN Applications," IEEE Custom Integrated Circuits Conference, pp. 9.4.1-9.4.4, May 1997.
Stefaan Van Gerven, et al., "Signal Separation by Symmetric Adaptive Decorrelation: Stability, Convergence, and Uniqueness," IEEE Transactions on Signal Processing, vol. 43, No. 7, pp. 1602-1612, Jul. 1995.
Fred Harris, "Digital Filter Equalization of Analog Gain and Phase Mismatch in I-Q Receivers," pp. 793-796, Sep. 1996.
Stefaan Van Gerven, et al., "On the Use of Decorrelation in Scalar Signal Separation," IEEE, pp. 57-60, Apr. 1994.
Mikko Valkama, et al., "Advance Methods for I/Q Imbalance Compensation in Communication Receivers," IEEE Transactions on Signal Processing, vol. 49, No. 10, pp. 2335-2344, Oct. 2001.
Supisa Lerstaveesin, et al., "A Complex Image Rejection Circuit With Sign Detection Only," IEEE Journal of Solid State Circuits, vol. 41, No. 12, pp. 2693-2702, Dec. 2006.
Dirk Van Compernolle, et al., "Signal Separation in a Symmetric Adaptive Noise Canceler by Output Decorrelation," 1992, pp. 221-224, March.
Farbod Behbahani, et al., "CMOS Mixers and Polyphase Filters for Large Image Rejection," IEEE Journal of Solid-State Circuits, vol. 36, No. 6, Jun. 2001, pp. 873-887.
Li Yu, "A Novel Adaptive Mismatch Cancellation System for Quadrature IF Radio Receivers," 1997, pp. 1-123, June.

* cited by examiner

PERFORMING IMAGE REJECTION ON BANDPASS SIGNALS

BACKGROUND

Many receivers, both radio and television, include an in-phase/quadrature (I/Q) demodulation architecture, in which a received modulated carrier signal is simultaneously applied to an I-channel mixer and a Q-channel mixer. A local oscillator (LO) is also applied to the mixers to effect frequency conversion from a radio frequency (RF) at which the radio signal is received to an intermediate frequency (IF). In an I/Q demodulator, the LO signal that is applied to this Q-channel mixer is offset by 90° from the LO signal that is applied to the I-channel mixer.

Image rejection is one metric by which receiver system performance may be evaluated. In general, image rejection refers to the ability of the receiver to reject responses resulting from RF signals at a frequency offset from the desired RF carrier frequency by an amount equal to twice the IF of a superheterodyne receiver. For example, if the desired RF signal is at 100 megahertz (MHz), and the receiver IF is 4 MHz, then the receiver LO will be tuned to 96 MHz. However, as is well known to those skilled in the art, the receiver will also exhibit a response to undesired RF signals (i.e., image signals) at a frequency 4 MHz below the LO frequency, in this case, 92 MHz. The receiver's response to the 92 MHz signal is referred to as the image response, because the image signal resides at a frequency opposite the LO frequency from the desired RF carrier, and offset from the LO frequency by the magnitude of the IF. A similar image signal appears to the high side, where the LO is greater than the desired RF carrier and the image frequency is larger than the LO frequency.

In a typical low-IF receiver architecture, mismatch between in-phase and quadrature phase paths cause image interference cross-talk. In many receivers, one or more strong adjacent channels may become the image interference and make reception unacceptable.

SUMMARY OF THE INVENTION

According to one aspect, an apparatus includes a signal channel path having a first mixer to receive a radio frequency (RF) signal and to downconvert the RF signal to a complex intermediate frequency (IF) signal including an in-phase portion and a quadrature portion, and an image rejection calibration circuit to receive the in-phase portion and the quadrature portion. In one example, the image rejection calibration circuit includes: a first filter to receive a value of the in-phase portion and to generate a first filtered in-phase portion value; a second filter to receive the in-phase portion value and to generate a second filtered in-phase portion value; a third filter to receive a value of the quadrature portion and to generate a first filtered quadrature portion value; a fourth filter to receive the quadrature portion value and to generate a second filtered quadrature portion value; a first combiner to combine the in-phase portion value with the first filtered in-phase portion value and the second filtered quadrature portion value to obtain an in-phase channel path output; and a second combiner to combine the quadrature portion value with the second filtered in-phase portion value and the first filtered quadrature portion value to obtain a quadrature channel path output.

The apparatus may further include a correlator to correlate a current sample of the quadrature channel path output with a current sample and at least one previous sample of the in-phase channel path output, and to correlate a current sample of the in-phase channel path output with a current sample and at least one previous sample of the quadrature channel path output. In one example, the correlator includes storages to store samples of the quadrature channel path output and multipliers to determine a product of one of the quadrature channel path output samples and the current sample of the in-phase channel path output. In addition in this example the correlator includes further storages to store samples of the in-phase channel path output and multipliers to determine a product of one of the in-phase channel path output samples and the current sample of the quadrature channel path output.

In one implementation, the first filter is a multi-tap filter including a plurality of delay elements and a plurality of real tap coefficients, and the fourth filter is a multi-tap filter including a plurality of delay elements and a plurality of imaginary tap coefficients. The IR calibration circuit may further include a first tap update circuit coupled to receive an output of the first and second combiners and to update a first tap coefficient of the first and fourth filters based thereon. This tap update circuit may be further coupled to receive a weighted portion of an output of the third combiner and to update the first tap coefficient of the first and fourth filters further based thereon.

In some embodiments, a detection circuit is coupled to the image rejection calibration circuit to detect an unintended correlation between a desired signal channel and an interferer channel. And, a controller is coupled to this detection circuit to prevent updating of tap coefficients of each of the filters responsive to detection of the unintended correlation.

Another aspect is directed to an IR circuit to receive a complex signal from a RF mixer, where the complex signal includes an in-phase signal portion and a quadrature signal portion. This IR circuit may include: an in-phase path to remove first mismatch information from the in-phase signal portion and associated with at least one in-phase multi-tap filter; a quadrature path to remove second mismatch information from the quadrature signal portion and associated with at least one quadrature multi-tap filter; and a correlation unit to independently update each of the multiple taps of the in-phase multi-tap filter and the quadrature multi-tap filter according to a priority scheme.

This in-phase path includes a first plurality of summers each to perform a partial sum between the in-phase signal portion and a portion of a first filtered in-phase signal portion and a portion of a second filtered quadrature signal portion, and the quadrature path includes a second plurality of summers each to perform a partial sum between the quadrature signal portion and a portion of a second filtered in-phase signal portion and a portion of a first filtered quadrature signal portion.

In one implementation, the in-phase path includes: a first stage having a first plurality of filters to filter the in-phase signal portion and the quadrature signal portion and a first plurality of combiners to combine the in-phase signal portion and the quadrature signal portion with an output of the first plurality of filters; and a second stage having a second plurality of filters to filter an output of the first stage and a second plurality of combiners to combine the output of the first stage with an output of the second plurality of filters. In one embodiment, the first plurality of filters are single tap filters and the second plurality of filters are multi-tap filters. Each of the first and second stages may be independently controlled. As an example, based on an interferer channel, the first stage is enabled and the second stage is disabled.

Another aspect is directed to a method for receiving and processing a complex IF signal, in an image rejection IR circuit of a receiver including a plurality of multi-tap filters, to remove mismatch information from the complex IF signal to obtain an image rejected complex IF signal including an in-phase portion and a quadrature portion. The method may further include comparing a measure of the in-phase portion and the quadrature portion to a first threshold power level, and disabling coefficient updates for at least a first portion of the multi-tap filters if the measure is greater than a first threshold power level. In turn, a difference of a second measure of the in-phase portion and a second measure of the quadrature portion may be compared to a second threshold power level and to cause disabling of coefficient updates for at least a second portion of the multi-tap filters if the difference is greater than the second threshold power level. Instead, coefficient updates using an output of a correlator of the IR circuit may be performed if the measure is not greater than the first threshold power level. In some embodiments, the IR circuit may be disabled when a level of an interferer channel is less than a threshold value.

DETAILED DESCRIPTION

Due to mismatches in an analog front end of a receiver having a complex signal path (i.e., in-phase (I) and quadrature-phase (Q) paths), part of an interference (e.g., image) signal may be within a desired signal band (and vice-versa). Embodiments seek to remove the interference signal from contaminating the desired signal. More specifically, adaptive finite impulse response (FIR) filters can remove the residuals from a signal processing path.

Figure 1:
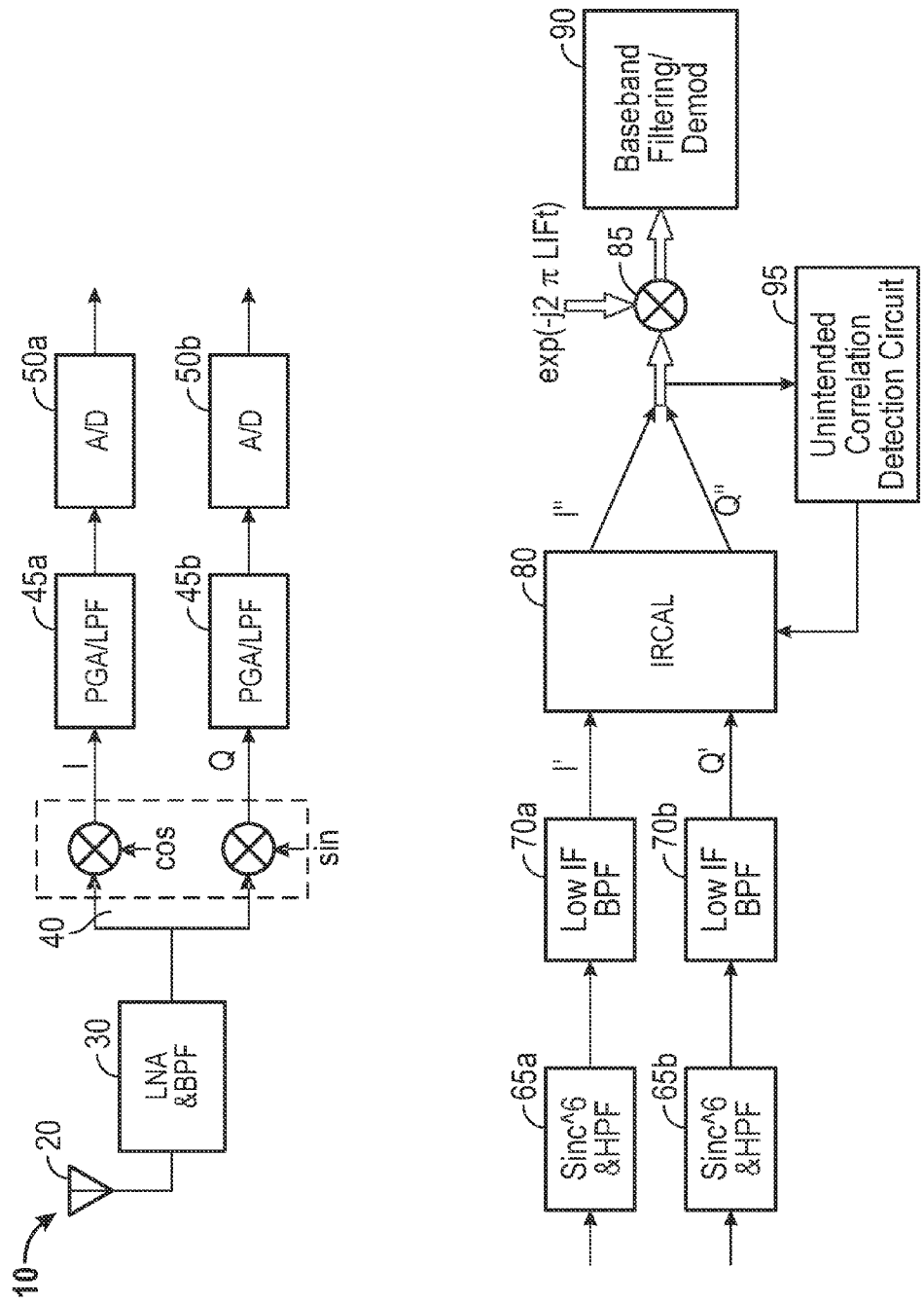
FIG. 1 is a block diagram of a receiver including an analog signal path and a digital signal path in accordance with one embodiment.

A high level architecture of a receiver in accordance with one embodiment is shown in FIG. 1. As shown in FIG. 1, receiver 10 includes an analog signal path and a digital signal path. In various embodiments, the digital signal path may be implemented using a digital signal processor (DSP). Furthermore, both the analog and digital portions may be implemented in a single integrated circuit, e.g., a single die CMOS circuit, although other circuits are possible.

As seen, incoming signals, which may be RF signals received over the air or in another manner, may be received via an antenna 20 that in turn is coupled to a low noise amplifier (LNA) and a bandpass filter (BPF) 30. The filtered and amplified RF signals are then provided to a mixer 40 which may be a complex mixer to downconvert these signals. Mixer 40 may also be a source of mismatch, as the multiphase mixer can cause a parasitic 2×LO mixing signal that causes mismatch even if the I and Q signal paths are aligned. Embodiments may provide for cancellation of this further source of mismatch.

In various implementations, the incoming signals may be downconverted to an intermediate frequency (IF), e.g., a low-IF frequency such as 4 MHz, although other frequencies are possible. Thus the output from mixer 40 provides I and Q signal paths. As seen, both signal paths are provided to a programmable gain amplifier (PGA)/low pass filter (LPF) $45_a$ and $45_b$ and in turn to an analog-to-digital converter (ADC) $50_a$ and $50_b$ such as a delta-sigma converter to digitize the signals.

Referring still to FIG. 1, the digitized signals may be provided to a digital signal path that may include various components including a decimator/high pass filter (HPF) $65_a$-$65_b$ to remove sigma-delta noise, and which may further include a high pass filter to suppress DC and low frequency (below desired channel) components. After such decimation/filtering, the digitized signals are provided to bandpass filters (BPFs) $70_a$-$70_b$ which perform low IF bandpass filtering on the signals. In an embodiment, these filters may operate at a sampling frequency (Fs) of 24 megahertz (MHz). These filtered digitized signals may then be provided to an IR calibration (IRCal) circuit 80, which as described further below may perform image rejection calibration or filtering to thus remove any image information present in the desired signal band. In various embodiments, IRCal circuit 80 may use adaptive filters (e.g., multiple N-tap adaptive FIR filters) to remove the residual interferer from the signal path. In an embodiment, IRCal circuit 80 may operate at a sampling rate of 24 mega samples per second (24 MS/s).

Thus the output from image rejection calibration circuit 80 provides a complex signal including an in-phase (real) or I portion and a quadrature (imaginary) or Q portion for the desired channel signal that has reduced or removed mismatches to allow the rejection of the image signal. Note that the image rejection is performed at an IF frequency, e.g., a low-IF frequency (LIF), rather that at baseband. While this image rejection calibration may occur at higher frequencies than if performed at baseband, the need for processing of a separate image channel is avoided. In addition, the processing may be simplified as compared to performing image rejection calibration at baseband, thus leading to a more efficient design even where the image rejection calibration is performed at a higher frequency than if performed at baseband.

Still referring to FIG. 1, the output from image rejection calibration circuit 80 (referred to as I″ and Q″) may then be downconverted to baseband via a second complex mixer 85. Note that in FIG. 1, the heavy lines indicate complex signals while the thinner lines indicate real signals. In an embodiment complex mixer 85 shifts the desired signal band down to baseband from 4 MHz. The mixing operation of −4 MHz is approximate since there is no effort to lock to the carrier frequency, in an embodiment. As a result, the frequency conversion to baseband may be in error by some unknown ppm (note that a FLL/PLL block following image rejection calibration can remove any residual frequency error by performing another fine frequency shift/mixing operation).

As seen, the complex output from mixer 85, namely including a real (in-phase) and an imaginary (quadrature) baseband signal is provided to a computation block 90 where further processing is performed including baseband filtering and demodulation to thus obtain the desired information of the desired signal channel.

Note also in FIG. 1 that an unintended-correlation detection circuit 95 may be coupled to the output of IRCal circuit 80. As will be described further below, in certain situations unintended correlations between a desired signal channel and an image channel may be present, which can impact updating of coefficients of multi-tap filters of the image rejection calibration circuit. Thus when this situation is detected, control signals may be sent from circuit 95 to IRCal circuit 80 to control a tap update process.

Figure 2B:
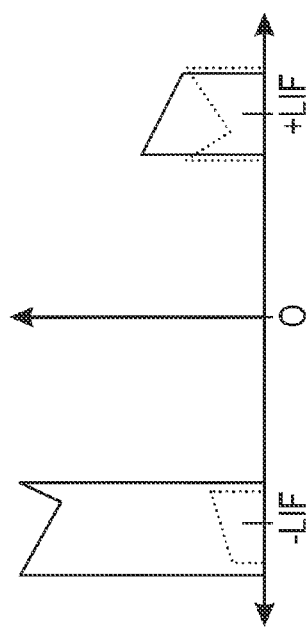
FIGS. 2A-2D are diagrams of the desired signal and interferer at different frequencies in accordance with one embodiment.
Figure 2D:
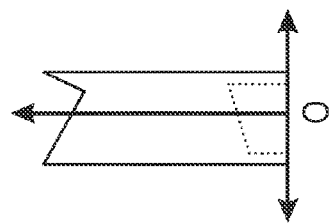
Figure 2A:
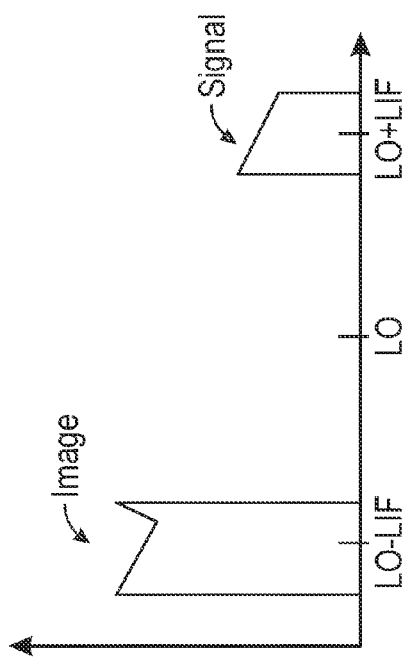
Figure 2C:
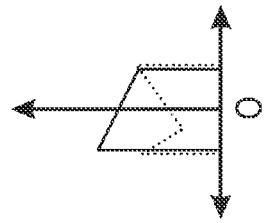

FIG. 2A shows the desired signal and interferer at RF, while FIG. 2B shows the translation to LIF, and finally to baseband as two separate complex paths in FIGS. 2C and 2D. As can be seen in FIGS. 2C and 2D, the interferer is contaminating the signal path and vice versa. IRCal in accordance with an embodiment will minimize this cross-contamination.

A receiver suffers from mismatches in the I/Q path and in an LO used to provide a mixing signal to a mixer, where $D(n)$=desired signal(at +IFfreq) and $U(n)$=undesired signal(at −IFfreq).

Assume that I/Q mismatch can be modeled as frequency independent. At the I/Q outputs of dual bandpass filters 70a and 70b of FIG. 1, the output signal, Out(n) is:

$Out(n)=[D(n)+U(n)]+a([U^*(n)+D^*(n)])$.

Separating into I and Q components: (where r,i signify real and imaginary parts):

$I(n)=D_r(n)+U_r(n)+a_rU_r(n)+a_iU_i(n)+a_rD_r(n)+a_iD_i(n)$ $Q(n)=D_i(n)+U_i(n)+a_iU_r(n)-a_rU_i(n)+a_iD_r(n)-a_rD_i(n)$

With regard to frequency dependent mismatches, at the I/Q outputs of dual bandpass filters, Out(n) is:

$$Out(n) = [D(n) + U(n)] + \sum_{j=1}^{N} a(j)(U^*(n-j+1)) + \sum_{j=1}^{N} a(j)(D^*(n-j+1))$$

Separating into I' and Q' non-ideal components, where (r, i signify real and imaginary parts):

$$I'(n) = D_r(n) + U_r(n) + \sum_{j=1}^{N} a_r(j)U_r(n-j+1) +$$

$$\sum_{j=1}^{N} a_i(j)U_i(n-j+1) + \sum_{j=1}^{N} a_i(j)D_i(n-j+1) + \sum_{j=1}^{N} a_r(j)D_r(n-j+1)$$

$$Q(n) = D_i(n) + U_i(n) + \sum_{j=1}^{N} a_i(j)U_r(n-j+1) - \sum_{j=1}^{N} a_r(j)U_i(n-j+1) +$$

$$\sum_{j=1}^{N} a_i(j)D_r(n-j+1) - \sum_{j=1}^{N} a_r(n)D_i(n-j+1)$$

Expressing I' and Q' in terms of ideal I/Q leads to the following:

$$I'(n) = I(n) + \sum_{j=1}^{N} a_r(j)I(n-j+1) + \sum_{j=1}^{N} a_i(j)Q(n-j+1); \text{ and}$$

$$Q'(n) = Q(n) + \sum_{j=1}^{N} a_i(j)I(n-j+1) - \sum_{j=1}^{N} a_r(j)Q(n-j+1).$$

Figure 3:
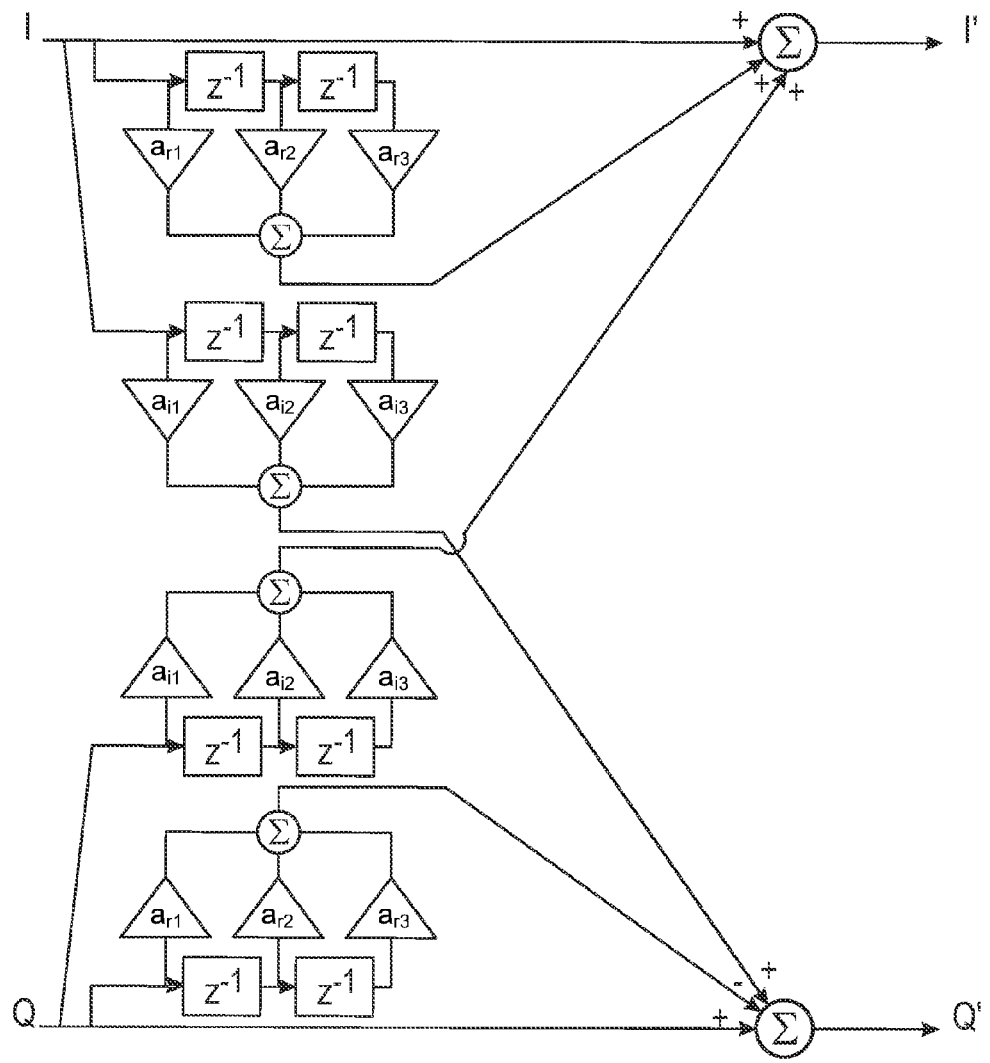
FIG. 3 is a model of an image rejection problem in accordance with one embodiment.

Referring now to FIG. 3, shown is a block diagram of an image mismatch model, with three taps (i.e., N=3), where N here is the number of taps to model errors. As seen incoming ideal I and Q signals are subjected to circuit non-idealities (as modeled by multi-tap filters, not present in the actual circuit), resulting in signals I' and Q' above.

Figure 4:
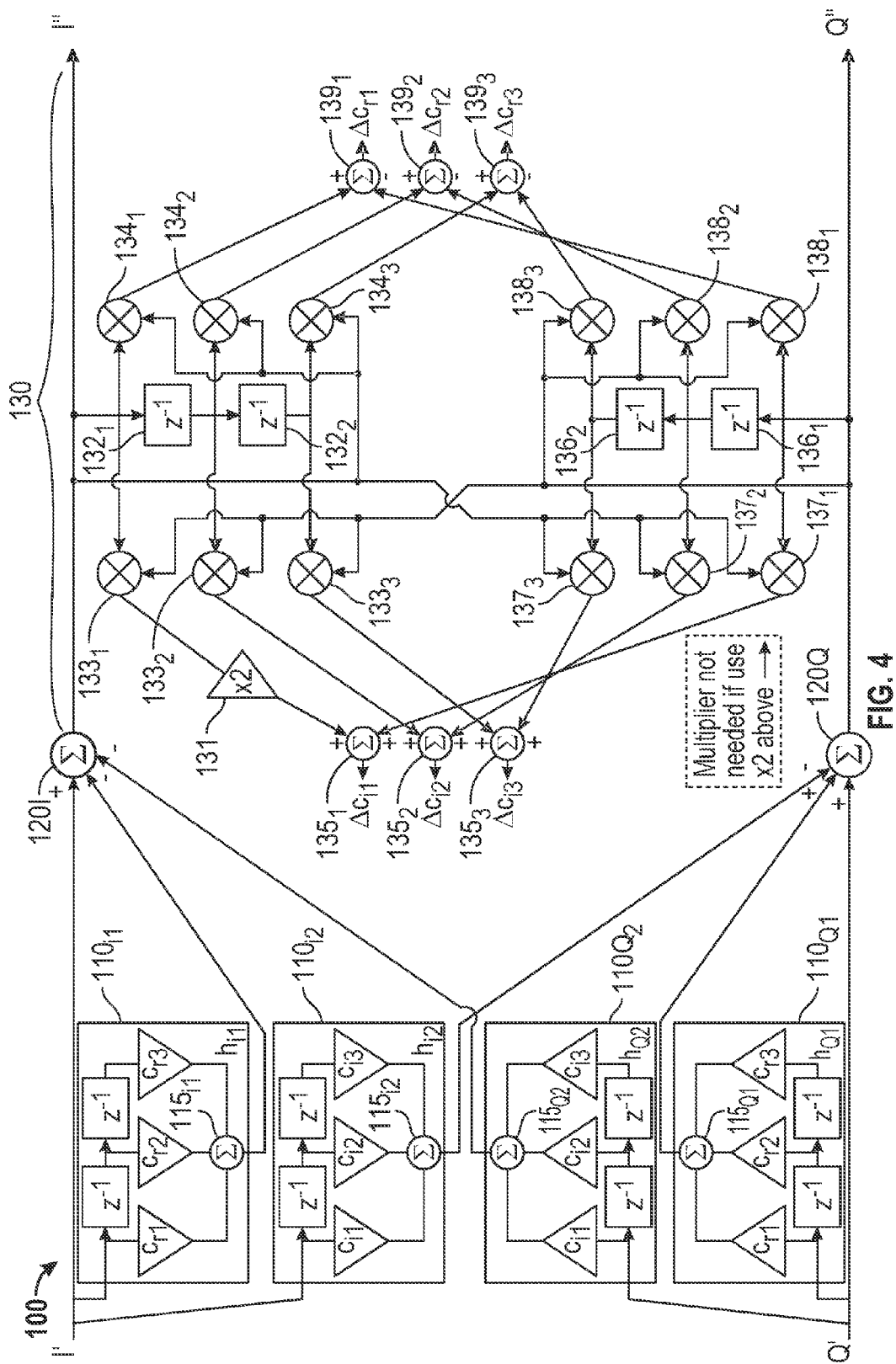
FIG. 4 is a block diagram of an image rejection calibration circuit in accordance with one embodiment.

Referring now to FIG. 4, shown is a block diagram of an IR calibration circuit in accordance with an embodiment. As shown in FIG. 4, IR calibration circuit 100 provides for removal of interfering signal information from a signal channel path. More specifically, a complex downconverted IF signal (I' and Q') is provided to corresponding summers 120$_I$-120$_Q$ of a signal processing path, where gain and phase errors can be removed based on outputs of a set of filters coupled to the signal processing path to provide resulting outputs I" and Q" that are provided to downstream circuitry, which can easily detect just the desired signal, by looking at both I" and Q".

As seen in FIG. 4, the incoming complex signal is provided to the set of filters. Specifically in the embodiment shown in FIG. 4, filters 110$_{I1}$ and 110$_{I2}$ are configured to receive the in-phase portion of the downconverted signal while filters 110$_{Q1}$ and 110$_{Q2}$ are configured to receive the quadrature portion of the downconverted signal. In the embodiment shown in FIG. 4, filters 110 are implemented as FIR filters having a 3-tap configuration, although other implementations are possible. More specifically, each of these filters includes two delay elements ($Z^{-1}$) and three tap coefficients. Namely, filter 110$_{I1}$ includes real coefficients $c_{r1}$-$c_{r3}$ and filter 110$_{I2}$ includes imaginary coefficients $c_{i1}$-$c_{i3}$. These four filters generate outputs that are obtained by combining the corresponding tap coefficient outputs in summers 115$_{I1}$-115$_{Q2}$. The resulting filtered values are provided to the corresponding summers of the signal processing path. In the embodiment shown in FIG. 4, the outputs of filters 110$_{I1}$ and 110$_{Q2}$ are subtracted from the in-phase portion of the complex signal in summer 120$_I$ while in turn the outputs of filters 110$_{I2}$ and 110$_{Q1}$ are subtracted and added, respectively, with the quadrature portion of the complex signal in summer 120$_Q$.

After performing image rejection calibration via circuit 100, the resulting signals I" and Q" are provided for further processing, namely in the remaining portion of the signal processing path shown in FIG. 1.

To update the set of filters, IRCAL adaptation equations may be used. Assume IRCAL correction is of the form:

$$I''(n) = I'(n) - \sum_{j=1}^{N} c_r(j)I'(n-j+1) - \sum_{j=1}^{N} c_i(j)Q'(n-j+1); \text{ and}$$

$$Q''(n) = Q'(n) + \sum_{j=1}^{N} c_r(j)Q'(n-j+1) - \sum_{j=1}^{N} c_i(j)I'(n-j+1).$$

Evaluating and dropping second order terms (e.g., $c_r(j) \cdot a_r(j)$, etc.) leads to:

$I''(n) \approx$ $$I(n) + \sum_{j=1}^{N} (a_r(j) - c_r(j))I(n-j+1) + \sum_{j=1}^{N} (a_i(j) - c_i(j))Q(n-j+1);$$

and $Q''(n) \approx$ $$Q(n) - \sum_{j=1}^{N} (a_r(j) - c_r(j))Q(n-j+1) + \sum_{j=1}^{N} (a_i(j) - c_i(j))I(n-j+1).$$

Still referring to FIG. 4, the image rejection calibrated signals are also provided to a correlation unit 130 that performs correlations between the real portion and the imaginary portion to generate updates for the coefficients of filters 110. Note that although a particular implementation is shown in FIG. 4, variations are possible. For example, in another implementation independent tap updating may be performed so that the coefficient values may be independently updated.

As seen in FIG. 4, correlation unit 130 includes first and second sets of correlators $133_1$-$133_3$ and $134_1$-$134_3$ (generically, correlators 133 and 134) coupled to receive the quadrature portion of the signal channel output. As further seen, a pair of storage elements $132_1$ and $132_2$ are configured to receive the real portion of the signal channel output (I") to thus store prior samples of the real portion of the signal channel output. These samples (and the current sample) may be provided to correlators 133 and 134 along with the current sample of the quadrature portion of the signal channel output (Q"). These correlators thus multiply these samples of the real portion of the signal channel output values with the current sample of the quadrature portion of the signal channel output.

In turn, correlation unit 130 also includes third and fourth sets of correlators $137_1$ $137_3$ and $138_1$-$138_3$ (generically, correlators 137 and 138) coupled to receive the real portion of the signal channel output. As further seen, a pair of storage elements $136_1$ and $136_2$ are configured to receive the quadrature portion of the signal channel output (Q") to thus store prior samples of the quadrature portion of the signal channel output. These samples (and the current sample) may be provided to correlators 137 and 138 along with the current sample of the real portion of the signal channel output (I"). These correlators thus multiply these samples of the quadrature portion of the signal channel output values with the current sample of the real portion of the signal channel output.

The resulting outputs of the correlators are provided to a set of summers $135_1$-$135_3$ and $139_1$-$139_3$ to thus provide updates for the coefficients of filters 110.

Note that the above implementation with multi-tap filters is used to correct a frequency response problem with regard to mismatches that occur across an entire frequency band. In some situations however, an interfering signal is only a tone that does not extend across an entire band and thus there is only a single magnitude and phase to correct. In such instances, a single tap of the filter may be sufficient to correct for this image problem. In fact, a single tone interferer can cause tap updating instability with the excess degrees of freedom provided by multiple taps.

To enable a single tap solution for such conditions while still allowing multi-tap filter correction for many other conditions, an image rejection calibration circuit may be differently implemented to provide for a separation between the different tap coefficients such that partial sums of the filter output are provided to the signal processing path. Thus while the filter transfer function remains the same, filter updates may occur according to a priority scheme in which the first tap is first updated based on errors only due to changes to this first tap coefficient. Then serially, the second tap coefficient can be updated based on the first and second tap coefficient updating and correction and similarly, the third tap coefficient can be updated based on the updating and correction to the first and second tap and third coefficients. Such priority scheme may be especially appropriate for situations in which multiple tonal interferers can occur across a band of operation.

In yet another embodiment, this priority updating scheme may be further adjusted to enable the upstream taps (namely the first tap and possibly the second tap) to receive at least a portion of the information regarding the downstream tap updates, e.g., by receiving weighted values of this information. Note further in such implementations that the weightings may be dynamically controlled.

Figure 5:
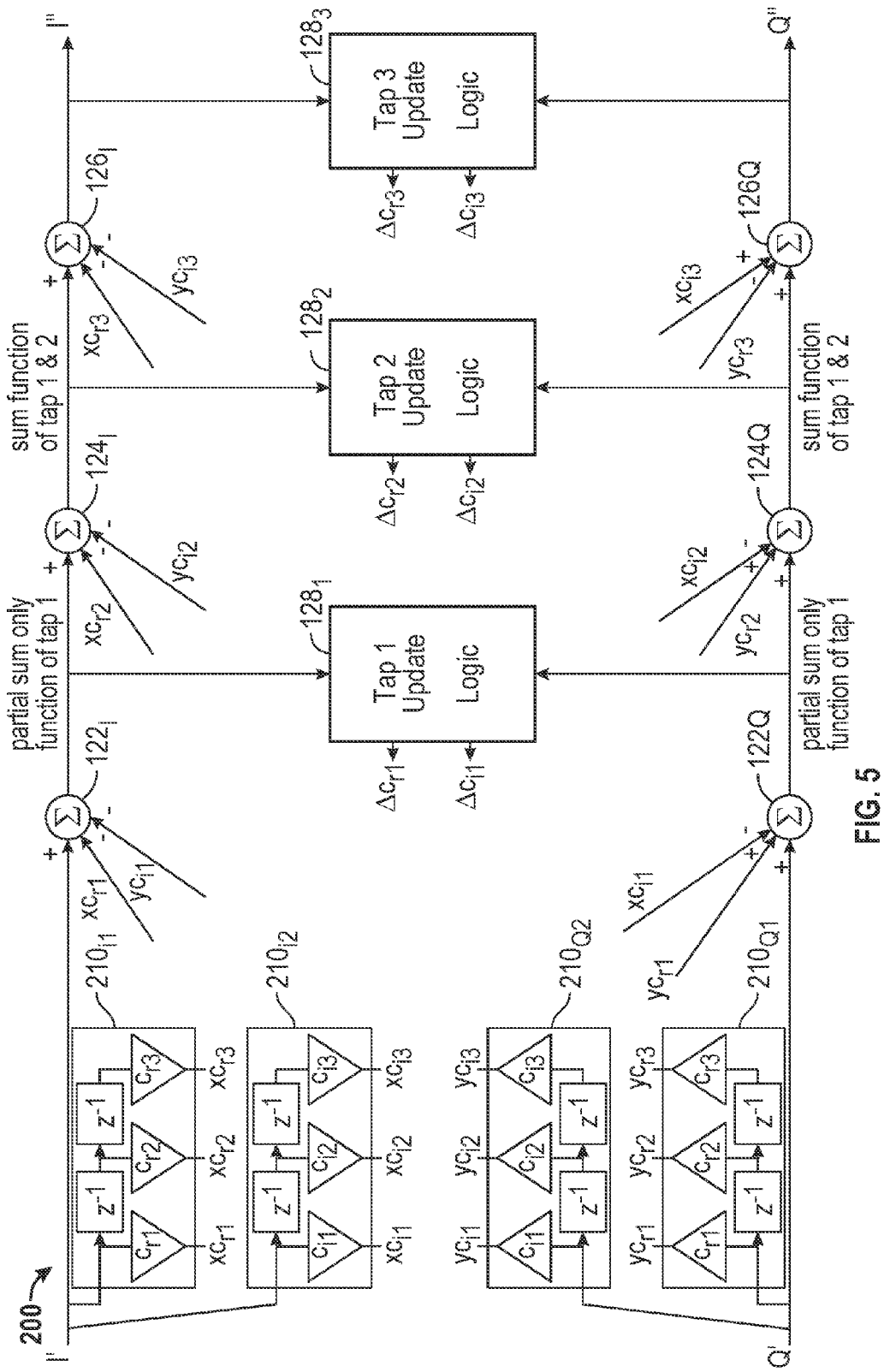
FIG. 5 is a block diagram of an image rejection calibration circuit in accordance with another embodiment.

Thus in other embodiments it is possible to perform a different type of filter coefficient updating. More specifically, in some embodiments the tap coefficients may be updated independently, potentially reducing computations. Referring now to FIG. 5, shown is a block diagram of an IR calibration circuit in accordance with another embodiment. Here, although the same filter structure is present for performing image rejection, a different correlation unit is provided. And furthermore, instead of summing the outputs of all filter taps via a single summer adapted on each branch of the signal processing path, a partial summation technique may be used in which each tap of the N-tap filter is independently or partially summed into the complex signal to enable updates to each tap coefficient to occur independently of downstream taps.

As shown in FIG. 5, at summers $122_I$-$122_Q$ only the outputs of the first filter taps are summed with the complex signal to output a partial sum that only includes the compensation provided by tap 1. In turn, at summers $124_I$ and $124_Q$ only the outputs of the second filter taps are summed with the complex signal (as filtered via the first tap contribution at summers $122_I$ and $122_Q$) to output a partial sum that only includes the compensation provided by taps 1 and 2. And at summers $126_I$ and $126_Q$ only the outputs of the third filter taps are summed with the complex signal (as filtered via the first and second tap contributions at summers 122 and 124) to output the image rejected complex signal. Thus in this embodiment, while tap 1 convergence affects taps 2 and 3, taps 2 and 3 do not affect convergence of tap 1. And similarly, while tap 2 convergence affects tap 3, tap 3 does not affect convergence of tap 2. Note that in another implementation an independent partial sum may be provided only for the first tap (and an independent tap update only for this first tap may occur) and combined summation and tap updating may occur for the additional taps. Understand that embodiments are not limited and there can be many combinations of priority tap updating. For example, tap 1 and 2 could be merged and tap 3 has highest priority.

Each of the taps may be independently updated in corresponding independent tap update logics $128_1$-$128_3$. In general, each of these update logics may perform equations as above for the given tap and may generally include appropriate correlators and delay elements as described above with regard to correlation unit 130 of FIG. 4. However note that each of the coefficients is independently updated such that in tap update logic $128_1$ the first real and imaginary tap coefficients are updated, while in tap update logic $128_2$, the second real and imaginary tap coefficients are updated, and similarly in tap update logic $128_3$ the third real and imaginary tap coefficients are updated. Still with reference to FIG. 5, the update operation for tap 1 is based on the partial sum only for the function of tap 1 while in turn the update operation for the second tap is based on the sum for the function of taps 1 and 2. For tap 3 however, the update is based on the resulting full sum of the image rejected complex signal output from the IRCal circuit. While shown with this particular implementation in the embodiment of FIG. 5, additional alternatives are possible. For example, to enable priority updating to adjust further based on some information from the downstream taps, weighted downstream information may be provided to the upstream tap update logic blocks.

Figure 6:
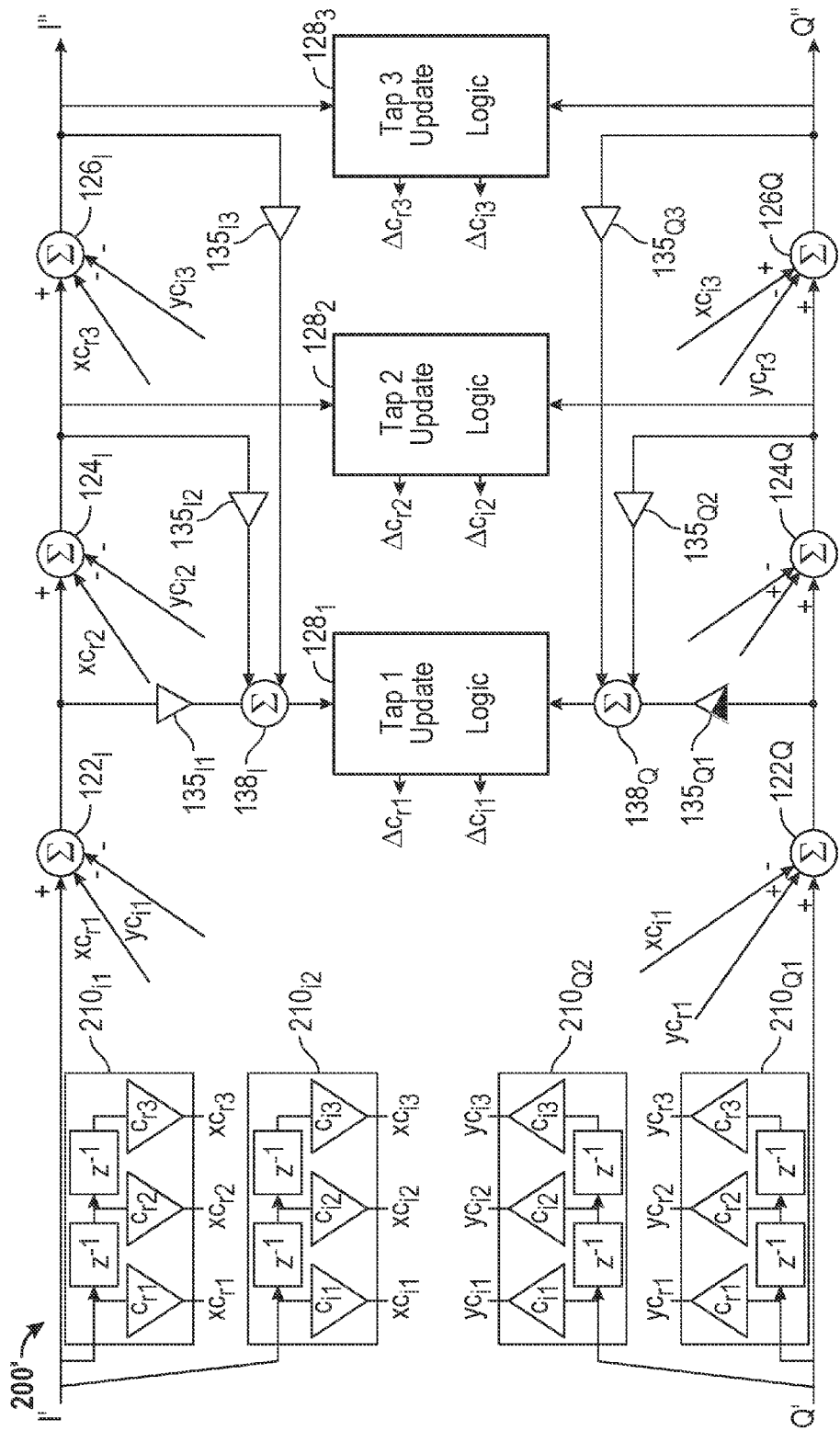
FIG. 6 is a block diagram of an image rejection calibration circuit in accordance with a still further embodiment.

Referring now to FIG. 6, shown is a block diagram of an image rejection calibration circuit in accordance with a still further embodiment. As seen in FIG. 6, calibration circuit 200' may be adapted similarly to that of circuit 200 of FIG. 5. However here note the inclusion of weighting function operators $135_{I1}$-$135_{I3}$ and $135_{Q1}$-$135_{Q3}$ that enable a controllable weighting of the outputs of each of combiners $122_I$-$126_I$ and $122_Q$-$126_Q$ to be provided to additional combiners $138_I$ and $138_Q$, respectively, that in turn provide a weighted partial sum to tap update logic $128_1$. While not shown in FIG. 6 for ease of illustration, understand that a controllable weighting of the output of combiners $126_I$ and $126_Q$ can equally be provided to tap update logic $128_2$. By providing these weighted values, at least some information from the downstream summers can be analyzed and used in updating the upstream tap coefficients. In an embodiment, a controller such as an MCU may control the weightings of the different weighting operators, e.g., based on detection of a location and type of interfering signal.

In still another embodiment, an image rejection calibration circuit can be configured with cascaded portions such that a first cascaded circuit includes a single tap filter to effectively handle tonal interferers without further contribution from additional taps. However, for situations in which multiple interfering tones are present or where noise exists over an entire band, multiple portions of the cascaded circuit can be enabled. In a most basic implementation two stages may be provided, namely a first stage portion including a single tap filter and a second stage including a multi-tap filter. As an example, the second stage may include a two-tap filter, although other implementations are possible. Here tap updates are prioritized such that the first tap coefficient is updated solely based on information for this single coefficient. And of course other examples are possible. For example, more than two cascaded portions may be provided. Furthermore, each cascaded portion may generally include M-tap filters, where M varies for each portion. For example, instead of a single tap filter in a first cascaded portion, a multi-tap filter may be provided in this as well as the other cascaded portions. Furthermore the number of taps in each cascaded portion may vary.

Figure 7:
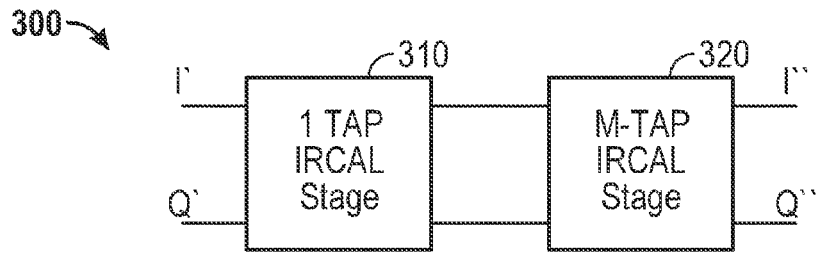
FIG. 7 is a block diagram of an image rejection calibration circuit in accordance with another embodiment.

Referring now to FIG. 7, shown is a block diagram of an image rejection calibration circuit in accordance with yet another embodiment. As shown in FIG. 7, circuit 300 similarly receives incoming complex IF signals I' and Q'. As seen in the embodiment of FIG. 7, a multi-stage calibration circuit is provided. In the embodiment of FIG. 7, a two-stage circuit is present including a first stage 310 and a second stage 320. In an embodiment, first stage 310 may be implemented including a single tap filter, while second stage 320 may include a multi-tap filter such as a two-tap filter. These tap filters may be implemented such as described above in FIGS. 4-6. However, for this implementation, only a single tap coefficient and no delay element is provided in first stage 310. In second stage 320, a multi-tap filter is provided, e.g., including a single delay element and two tap coefficients. In an embodiment, updating of these taps is prioritized. The updating is similarly effected such that the tap for first stage 310 is updated based only on this filter's contribution. Instead for second stage 320, the multiple taps may be updated in a prioritized manner using a multi-combiner structure such as shown in FIG. 5. Furthermore, at least partial weighting of downstream tap coefficient updates may be effected similarly to that shown in FIG. 6.

When an interfering signal is of a single tone, only first stage 310 may be active, reducing power consumption while achieving the desired image rejection. Instead when multiple tones are present across a band, or an interfering signal extends across an entire band, both of these stages may be active. Note further that although shown with only two stages, in certain embodiments more than two stages may be present. Note that this overall transfer function is not the same as the transfer function for the multi-tap filter present in the above image rejection calibration circuits of FIGS. 4-6.

Note that the above analysis with regard to updating coefficients for the filters assumes that the image and the signal are wholly uncorrelated. With this assumption in place, the above equations are thus simplified and the corresponding logic for performing coefficient updates is of reduced size and complexity. However, in certain situations correlations may exist between the signal channel and an image signal. For example, when processing video NTSC signals that have a particular pattern such as a checkerboard pattern, interfering tones may exist throughout the signal spectrum. As the correlation process is generally implemented via a multiplication and averaging operation, the tap updating may be biased or oscillate at the resultant beat frequency.

Accordingly, embodiments provide a technique to detect unintended correlations between a desired signal and an image signal and disable coefficient updating for the filters when such condition is detected. In an embodiment this unintended correlation detection, which may be implemented in a logic circuit coupled to an output of the IRCal circuit (as shown in FIG. 1), determines when the average difference in power of the in-phase (I") and quadrature (Q") signals or when the average correlation of the in-phase and quadrature signals exceeds a threshold value, e.g., 10% of their average power. Note that 10% is a value chosen to be larger than the maximum expected I/Q mismatch. When such unintended correlation is detected, the correlation updating may be disabled to prevent the coefficients from diverging or oscillating.

As seen above in FIGS. 4 and 5 and the associated equations, IRCAL adapts coefficients based on a series of correlation measurements. The above derived equations dropped numerous terms, under the assumption that correlations did not exist. Embodiments may be used to measure unintended correlations and if the correlations are too large, to control the coefficients not to be updated.

The correlation measurements used to update imaginary coefficients are as follows:

$$c_{ij}^{k+1} = c_{ij}^k + \mu[I''(n-j+1)Q''(n) + Q''(n-j+1)I''(n)]$$

$$c_{ij}^{k+1} \approx c_{ij}^k + \mu(a_{ij} - c_{ij}^k)[I^2(n-j+1) + Q^2(n-j+1)]$$

For $j=1$ $$I''(n)Q''(n) \approx 0.5*(a_{i1} - c_{i1})[I^2(n) + Q^2(n)]$$

However, terms were dropped in the above equation. Re-inserting critical parameters a more complete formulation is:

$$I''(n)Q''(n) \approx I(n)Q(n) + 0.5*(a_{i1} - c_{i1})[I^2(n) + Q^2(n)]$$

Ideally, the correlation of $I(n)Q(n)$ should be zero, but in degenerate cases it is not.

It can be shown that:

$$I''(n)Q''(n) \approx I(n)Q(n);$$

$$I''^2(n) \approx I^2(n) \text{ and } Q''^2(n) \approx Q^2(n)$$

Therefore in an embodiment, imaginary coefficients may be controlled to stop updating, if:

$$|(ave(I''(n)Q''(n)))| > 0.1*[ave(I''^2(n)) + ave(Q''^2(n))]$$

Note that the unintended correlation for all imaginary coefficients may be checked. However, to save computations it is assumed that all will behave similarly since the equations are nearly the same. That is, while this inequality is shown for the first tap only, it can be assumed that the same unintended correlations exist for the other taps also. Understand that similar equations to this unintended correlation inequality can be derived to detect presence of an unintended correlation.

Correlation measurements used to update real coefficients are as follows:

$$c_{r_j}^{k+1}+1 = c_{r_j}^k + \mu[I'(n-j+1)I'(n) - Q''(n-j+1)Q''(n)]$$

$$c_r^{k+1} \approx c_{r_j}^k + \mu(a_{r_j} - c_{r_j}^k)[I^2(n-j+1) + Q^2(n-j+1)]$$

For $j=1$ $$I''^2(n) - Q''^2(n) \approx (a_{r1} - c_{r1})[I^2(n) + Q^2(n)]$$

However, terms were dropped in the above equation. Re-inserting critical parameters a more complete formulation is:

$$I''^2(n) - Q''^2(n) \approx [I^2(n) - Q^2(n)] + a_{r1} - c'_1)[I^2(n) + Q^2(n)]$$

Ideally, the first term above is zero, but will not be in the degenerate case.

It can be shown that:

$$I''^2(n) \approx I^2(n) \text{ and } Q''^2(n) \approx Q^2(n)$$

Therefore in an embodiment, real coefficients may be controlled to stop updating if:

$$|(ave(I''^2(n)) - ave(Q''^2(n)))| > 0.1 * [ave(I''^2(n)) + ave(Q''^2(n))]$$

Note that the unintended correlation for all real coefficients may be checked. However, to save computations it is assumed that all will behave similarly since the equations are nearly the same.

In general, this unintended correlation detection operation may be performed in a logic circuit coupled to an output of the IR calibration circuits shown above. When a given unintended correlation is detected, one or more control signals can be sent, each into the correlation unit directly or to a controller such as an MCU that controls the circuit to stop updating the tap coefficients while this unintended correlation is detected. Note that unintended correlations may be detected independently for the in-phase and quadrature portions of the complex output of the IR calibration circuit and as such, independent control signals may be sent to independently disable tap coefficient updating of the real and imaginary tap coefficients.

Figure 8:
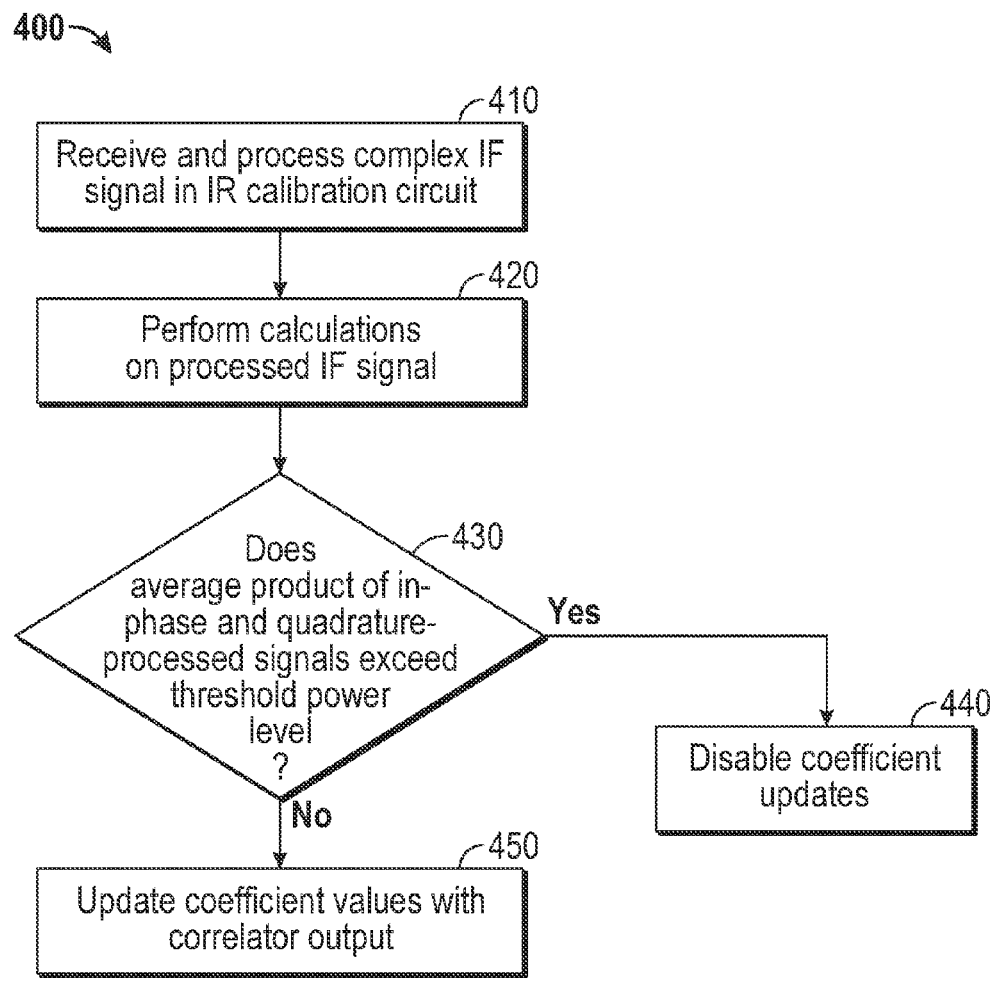
FIG. 8 is a flow diagram of a method in accordance with an embodiment.

Referring now to FIG. 8, shown is a flow diagram of a method in accordance with an embodiment. Method 400 of FIG. 8 may be performed in part using logic and circuitry within the unintended correlation detection circuit. As seen, method 400 begins by receiving and processing a complex IF signal in an IR calibration circuit. For example, an incoming IF signal can be processed in circuit 100 of FIG. 4. Then at block 420 calculations may be performed on the processing IF signal. In various embodiments, different inequalities may be calculated and analyzed such as described above. In general, these inequalities may compare a measure of output power of the processed IF outputs from the IR calibration circuit to a threshold. In different implementations this threshold may be based on a predetermined percentage of one or more other power measures from the processed IF outputs.

Still referring to FIG. 8, next control passes to diamond 430 where it can be determined whether the average product of the in-phase and quadrature portions of the processed signal exceeds a threshold level. This determination may be made to control updates for real coefficients of the multi-tap filters. If this average product is greater than the threshold power level, control passes to block 440 where coefficient updates may be disabled. Otherwise, control passes to block 450 where coefficient values may continue to be updated with the output of the correlation unit as discussed above. Note that while described with this particular implementation in FIG. 8, e.g., with the analysis of a comparison of an average product to the threshold power level, other power measures instead may be used and compared to different threshold levels. For example, to control imaginary coefficients another power measure of the processed signal can be compared to a different threshold.

Note that unintended correlation detection may also be used in connection with baseband IRCAL as described in U.S. Pat. No. 8,265,584 (the '584 patent), the disclosure of which is incorporated herein by reference. As described in that patent, the main correlation equation is:

$$OUT1(n)OUT2(n) = S(n)I(n) + (a_{21} - c_{21})|I(n)|^2 + (a_{22} - c_{22})I(n)I^*(n-1) + (a_{23} - c_{23})I(n)I^*(n-2) + (a_{11} - c_{11})|S(n)|^2 + (a_{12} - c_{12})S(n)S^*(n-1) + (a_{13} - c_{13})S(n)S^*(n-2) + \ldots$$

Assuming, that there is no long term correlation between $S(n)$ and $1(n)$ as well as between different samples of $I(n)$ and different samples of $S(n)$, then the above equation can be simplified to:

$$OUT1(n)OUT2(n) = (a_{21} - c_{21})|I(n)|^2 + (a_{11} - c_{11})|S(n)|^2$$

In this case, unintended correlation may be determined according to the following inequality:

$$|(ave(OUT1(n)*OUT2(n)))| > 0.05 * [ave(|(OUT1(n))|^2) + ave(|(OUT2(n))|^2)]$$

where OUT1 and OUT2 are the signal and interferer outputs of the image rejection calibration rejection block of FIG. 4 of the '584 patent.

If the above inequality is true, all coefficient updating may be stopped (note that all computations above are complex).

In cases of low image power, IR calibration in accordance with an embodiment may be disabled to reduce power consumption. In an embodiment, if the image power is 30 dB less than then signal power, the native image rejection of the receiver is adequate, and thus the IR calibration circuit may be disabled by setting all coefficients of the filtering to zero, e.g., by a controller.

$$10\log_{10}\left[\frac{ave(|(OUT1(n))|^2)}{ave(|(OUT2(n))|^2)}\right] > 30 \text{ dB}$$

Embodiments may also optimize the number of active FIR taps. Depending on the image signal, 3 taps (or even 2 taps) can have more degrees of freedom than necessary. The LMS algorithm can converge to a local minimum. A single tone image signal typically only requires a single tap for optimal performance. The procedure below tests IRCAL with 1, 2 or 3 taps and then uses the configuration that provides the best image rejection.

The following equation provides an estimate of the image rejection resulting from the first tap only.

$$IR \approx 10\log_{10}\left[\frac{|(ave(OUT1(n)OUT2(n)))|}{ave(|(OUT1(n))|^2) + ave(|(OUT2(n))|^2)}\right]$$

In an embodiment, the procedure to optimize the number of taps in the FIR filter is as follows: tune to new channel; activate tap 1, set tap 2 and tap 3 to zero; measure IR with above equation; activate tap 2, while keeping tap 1 on; measure IR. If IR degrades, shut off tap 2 and just use a single tap FIR; if IR improves, active tap 3, while keeping taps 1 and 2 on; measure IR. If IR degrades, shut off tap 3 and let tap 1 and 2 operate normally; if IR improves, keep all three taps continually running. Then during normal operation, the number of active taps may be periodically changed to determine the optimal solution. Note the above equation is for use in baseband IRCAL circuit. A similar algorithm for bandpass IRCAL could also be used, in which the number of taps is essentially progressively increased to find the best performance.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
    a signal channel path including a first mixer to receive a radio frequency (RF) signal and to downconvert the RF signal to a complex intermediate frequency (IF) signal including an in-phase portion and a quadrature portion;
    an image rejection calibration circuit to receive the in-phase portion and the quadrature portion and including:
        a first filter to receive a value of the in-phase portion and to generate a first filtered in-phase portion value;
        a second filter to receive the in-phase portion value and to generate a second filtered in-phase portion value;
        a third filter to receive a value of the quadrature portion and to generate a first filtered quadrature portion value;
        a fourth filter to receive the quadrature portion value and to generate a second filtered quadrature portion value;
        a first combiner to combine the in-phase portion value with the first filtered in-phase portion value and the second filtered quadrature portion value to obtain an in-phase channel path output; and
        a second combiner to combine the quadrature portion value with the second filtered in-phase portion value and the first filtered quadrature portion value to obtain a quadrature channel path output.

2. The apparatus of claim 1, further comprising a correlator to correlate a current sample of the quadrature channel path output with a current sample and at least one previous sample of the in-phase channel path output.

3. The apparatus of claim 2, wherein the correlator is further to correlate a current sample of the in-phase channel path output with a current sample and at least one previous sample of the quadrature channel path output.

4. The apparatus of claim 3, wherein the correlator includes storages to store a plurality of samples of the in-phase channel path output and a plurality of multipliers to determine a product of one of the plurality of in-phase channel path output samples and the current sample of the quadrature channel path output.

5. The apparatus of claim 2, wherein the correlator includes storages to store a plurality of samples of the quadrature channel path output and a plurality of multipliers to determine a product of one of the plurality of quadrature channel path output samples and the current sample of the in-phase channel path output.

6. The apparatus of claim 2, wherein the image rejection calibration circuit is to update at least one of the first, second, third and fourth filters based on the correlator output.

7. The apparatus of claim 1, further comprising a third combiner coupled to an output of the first combiner to combine the first combiner output with a second portion of the first filtered in-phase portion and a second portion of the second filtered quadrature portion, wherein the first combiner is to combine the in-phase portion value with a first portion of the first filtered in-phase portion and a first portion of the second filtered quadrature phase portion.

8. The apparatus of claim 7, wherein the first filter comprises a multi-tap filter including a plurality of delay elements and a plurality of real tap coefficients.

9. The apparatus of claim 8, wherein the fourth filter comprises a multi-tap filter including a plurality of delay elements and a plurality of imaginary tap coefficients.

10. The apparatus of claim 9, further comprising a first tap update circuit coupled to receive an output of the first combiner and the second combiner and to update a first tap coefficient of the first and fourth filters based thereon.

11. The apparatus of claim 10, wherein the first tap update circuit is further coupled to receive a weighted portion of an output of the third combiner and to update the first tap coefficient of the first and fourth filters further based thereon.

12. The apparatus of claim 1, further comprising a detection circuit coupled to the image rejection calibration circuit to detect an unintended correlation between a desired signal channel and an interferer channel.

13. The apparatus of claim 12, further comprising a controller to prevent updating of tap coefficients of each of the first, second, third and fourth filters responsive to detection of the unintended correlation.

14. The apparatus of claim 1, wherein the apparatus comprises a digital circuit to receive the complex IF signal as a digital complex signal and to provide the in-phase channel path output and the quadrature channel path output to a digital signal processor to perform demodulation of the outputs to obtain demodulated information.

15. An apparatus comprising:
    an image rejection (IR) circuit to receive a complex signal from a radio frequency (RF) mixer, the complex signal including an in-phase signal portion and a quadrature signal portion, the IR circuit including:
        an in-phase path to remove first mismatch information from the in-phase signal portion and associated with at least one in-phase multi-tap filter, and including a first plurality of summers each to perform a partial sum between the in-phase signal portion and a portion of a first filtered in-phase signal portion and a portion of a second filtered quadrature signal portion;
        a quadrature path to remove second mismatch information from the quadrature signal portion and associated with at least one quadrature multi-tap filter, and including a second plurality of summers each to perform a partial sum between the quadrature signal portion and a portion of a second filtered in-phase signal portion and a portion of a first filtered quadrature signal portion; and
        a correlation unit to independently update each of the multiple taps of the at least one in-phase multi-tap filter and the at least one quadrature multi-tap filter according to a priority scheme.

16. The apparatus of claim 15, further comprising:
    a first filter to filter the in-phase signal portion and to output the first filtered in-phase signal portion as a plurality of portions;
    a second filter to filter the in-phase signal portion and to output the second filtered in-phase signal portion as a plurality of portions, the first and second filters corresponding to the at least one in-phase multi-tap filter;
    a third filter to filter the quadrature signal portion and to output the first filtered quadrature signal portion as a plurality of portions; and
    a fourth filter to filter the quadrature signal portion and to output the second filtered quadrature signal portion as a plurality of portions, the third and fourth filters corresponding to the at least one quadrature multi-tap filter.

17. The apparatus of claim 15, wherein the in-phase path includes:
    a first stage including a first plurality of filters to filter the in-phase signal portion and the quadrature signal portion and a first plurality of combiners to combine the in-phase signal portion and the quadrature signal portion with an output of the first plurality of filters; and
    a second stage including a second plurality of filters to filter an output of the first stage and a second plurality of combiners to combine the output of the first stage with an output of the second plurality of filters.

18. The apparatus of claim 17, wherein the first plurality of filters comprises single tap filters and the second plurality of filters comprises multi-tap filters.

19. The apparatus of claim 17, wherein the first stage and the second stage are independently controlled and wherein based on an interferer channel, the first stage is enabled and the second stage is disabled.

20. A method comprising:
    receiving and processing a complex intermediate frequency (IF) signal, in an image rejection (IR) circuit of a receiver including a plurality of multi-tap filters, to remove mismatch information from the complex IF signal to obtain an image rejected complex IF signal including an in-phase portion and a quadrature portion;
    comparing a measure of the in-phase portion and the quadrature portion to a first threshold power level, and disabling coefficient updates for at least a first portion of the multi-tap filters if the measure is greater than the first threshold power level; and
    comparing a difference of a second measure of the in-phase portion and a second measure of the quadrature portion to a second threshold power level and disabling coefficient updates for at least a second portion of the multi-tap filters if the difference is greater than the second threshold power level.

21. The method of claim 20, further comprising performing the coefficient updates using an output of a correlator of the IR circuit if the measure is not greater than the first threshold power level.

22. The method of claim 20, further comprising disabling the IR circuit when a level of an interferer channel is less than a threshold value.

* * * * *